(12) United States Patent
Saitou et al.

(10) Patent No.: US 7,084,658 B2
(45) Date of Patent: Aug. 1, 2006

(54) SEMICONDUCTOR INTEGRATED CIRCUIT DEVICE

(75) Inventors: Teruhiko Saitou, Kasugai (JP);
Akihiro Ogasawara, Kasugai (JP);
Atsuhiro Sengoku, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 10 days.

(21) Appl. No.: 10/869,075

(22) Filed: Jun. 17, 2004

(65) Prior Publication Data

US 2005/0156615 A1    Jul. 21, 2005

(30) Foreign Application Priority Data

Jan. 20, 2004   (JP)   ............................. 2004-011400

(51) Int. Cl.
*G01R 31/02*  (2006.01)
*G01R 31/06*  (2006.01)

(52) U.S. Cl. ........................ 324/763; 324/765

(58) Field of Classification Search ..................... None
See application file for complete search history.

(56) References Cited

U.S. PATENT DOCUMENTS

| 5,065,091 A | 11/1991 | Youichi |
| 5,612,963 A | 3/1997 | Henriksson et al. |
| 5,903,512 A | 5/1999 | Bozidar et al. |
| 2002/0129234 A1 | 9/2002 | Pascal et al. |

FOREIGN PATENT DOCUMENTS

JP    6-309475    11/1994

*Primary Examiner*—Paresh Patel
(74) *Attorney, Agent, or Firm*—Arent Fox PLLC

(57) ABSTRACT

A semiconductor integrated circuit device has a pair of oscillator terminals that is respectively provided with two oscillation signals having phases opposite to each other. An oscillator circuit provides an internal circuit with a system clock signal based on the oscillation signals. A mode detection circuit detects that the pair of oscillator terminals is respectively provided with two input signals having the same phase, and provides a test circuit with a detection signal. The test circuit sets a test mode according to the detection signal, and provides the internal circuit with a predetermined test signal. By setting the test mode using a pair of external terminals, an increase in the number of external terminals of the semiconductor integrated circuit device can be prevented.

8 Claims, 12 Drawing Sheets

SEMICONDUCTOR INTEGRATED CIRCUIT DEVICE

CROSS-REFERENCE TO RELATED APPLICATIONS

This application is based upon and claims the benefit of priority from the prior Japanese Patent Application No. 2004-011400, filed on Jan. 20, 2004, the entire contents of which are incorporated herein by reference.

BACKGROUND OF THE INVENTION

The present invention relates to a semiconductor integrated circuit device, and more particularly, to a semiconductor integrated circuit device that sets a test mode using a reduced number of external terminals.

In recent years, packages and chip areas of semiconductor integrated circuit devices have been increasingly downsized. A package of a semiconductor integrated circuit device has a plurality of external terminals. To downsize the package, it is desired to reduce the number of external terminals.

FIG. 1 shows a conventional semiconductor integrated circuit device 1 with the function of a clock generator. The device 1 includes a package 2 having eight external terminals X. A crystal oscillator H is connected to a pair of external terminals (oscillator terminals) X0 and X1. The crystal oscillator H and an internal oscillator circuit (not shown) generate a clock signal having a predetermined frequency. The other external terminals X in the device 1 are used as a power supply pin, input and output pins, and the like.

The package 2 contains an IC chip 3. The IC chip 3 has pads 3a connected to the external terminals, and pads 3b specially provided for testing purposes. Before the IC chip 3 is packaged, a tester is connected to a pad 3b for testing, to conduct the operation test of the IC chip 3. The device 1 does not have external terminals specially provided for testing purposes (test terminals). In this way, the package 2 is downsized.

Japanese Laid-Open Patent Publication No. 6-309475 discloses a technique for setting a semiconductor integrated circuit device in a test mode without providing test terminals for setting the test mode. According to this technique, the test mode is set by controlling a waveform of a power supply voltage and detecting a change in the power supply voltage. This technique enables the device after packaging to be set to conduct testing, without requiring the device to have test terminals within its package.

SUMMARY OF THE INVENTION

The device 1 does not have test terminals. This means that the operation test of the IC chip 3 cannot be conducted after the IC chip 3 is packaged. If external terminals for testing purposes are added to the package 2 to enable the after-packaging operation test of the device 1, the chip area of the device 1 increases.

The technique disclosed in Japanese Laid-Open Patent Publication No. 6-309475 of setting the test mode by changing the power supply voltage is not practical for use. This is because a power supply voltage within a predetermined standard is required, to appropriately operate an internal circuit of the device.

In a first aspect of the present invention, a semiconductor integrated circuit device is provided that operates in a first mode based on first and second signals having phases opposite to each other. The semiconductor integrated circuit device includes a pair of external terminals that is provided with the first and second signals respectively, and a detection circuit for generating a detection signal that causes the semiconductor integrated circuit device to operate in a second mode different from the first mode when the pair of external terminals is provided with a third and fourth signals having the same phase respectively.

In a second aspect of the present invention, a semiconductor integrated circuit device is provided. The device includes a pair of oscillator terminals, an oscillator circuit for generating a clock signal that causes the semiconductor integrated circuit device to operate based on first and second oscillation signals with which the pair of oscillator terminals is provided respectively, the first and second oscillation signals having phases opposite to each other, and a detection circuit for generating a detection signal to set the semiconductor integrated circuit device in a test mode when the pair of oscillator terminals is provided with a first and second input signals having the same phase respectively.

In a third aspect of the present invention, a semiconductor integrated circuit device is provided. The device includes a pair of oscillator terminals, an oscillator circuit for generating a first clock signal having a first frequency based on first and second oscillation signals with which the pair of oscillator terminals is provided respectively, the first and second oscillation signals having phases opposite to each other, an internal circuit that operates in accordance with the first clock signal, a detection circuit for generating a detection signal when the pair of oscillator terminals is provided with a first and second input signals having the same phase respectively, and a clock switch circuit, connected to the detection circuit, for generating a second clock signal having a second frequency higher than the first frequency based on one of the first and second input signals in response to the detection signal, and providing the internal circuit with the second clock signal instead of the first clock signal.

In a fourth aspect of the present invention, a semiconductor integrated circuit device is provided. The devise includes a pair of oscillator terminals, an oscillator circuit for generating a clock signal based on first and second oscillation signals with which the pair of oscillator terminals is provided respectively, the first and second oscillation signals having phases opposite to each other, and a detection circuit for generating a detection signal to set the semiconductor integrated circuit device in a test mode when at least one of the oscillator terminals is provided with an input signal having a signal level out of a range of an amplitude level of the first and second oscillation signals.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
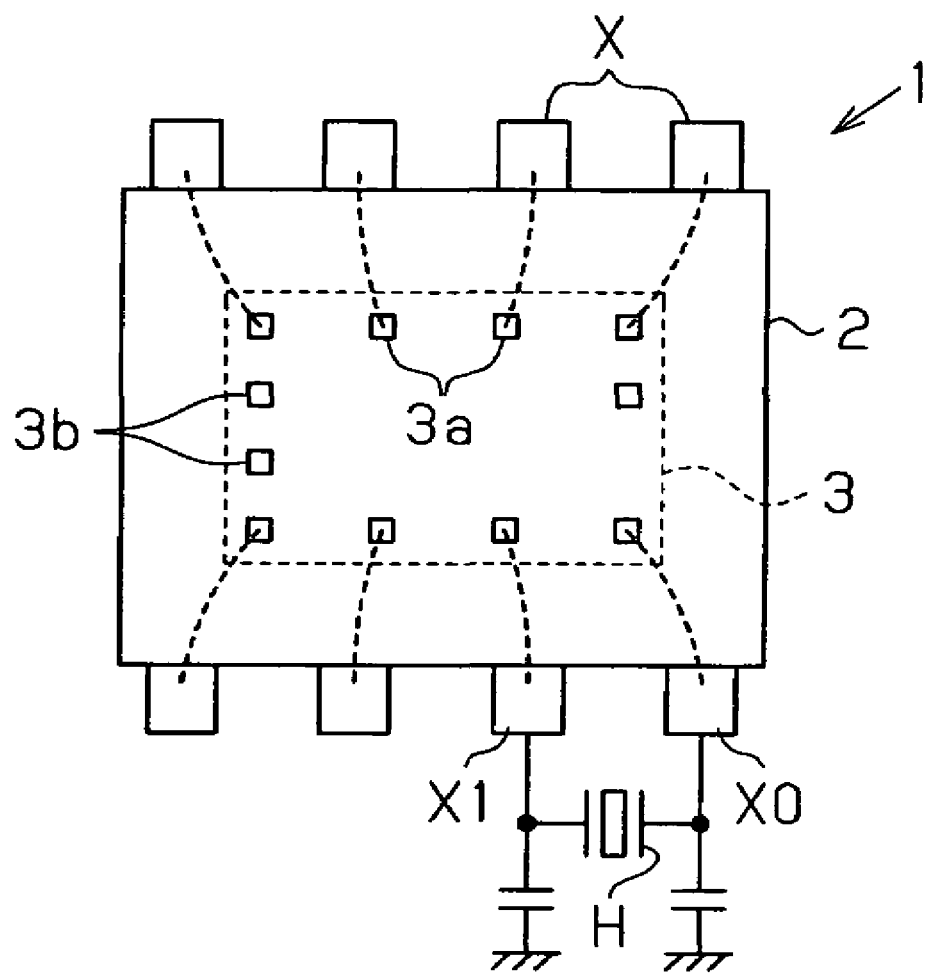
FIG. 1 is an explanatory diagram showing a conventional semiconductor integrated circuit device.

In the drawings, like numerals are used for like elements throughout.

The following describes a semiconductor integrated circuit device 10 according to a first embodiment of the present invention, with reference to the drawings.

Figure 2:
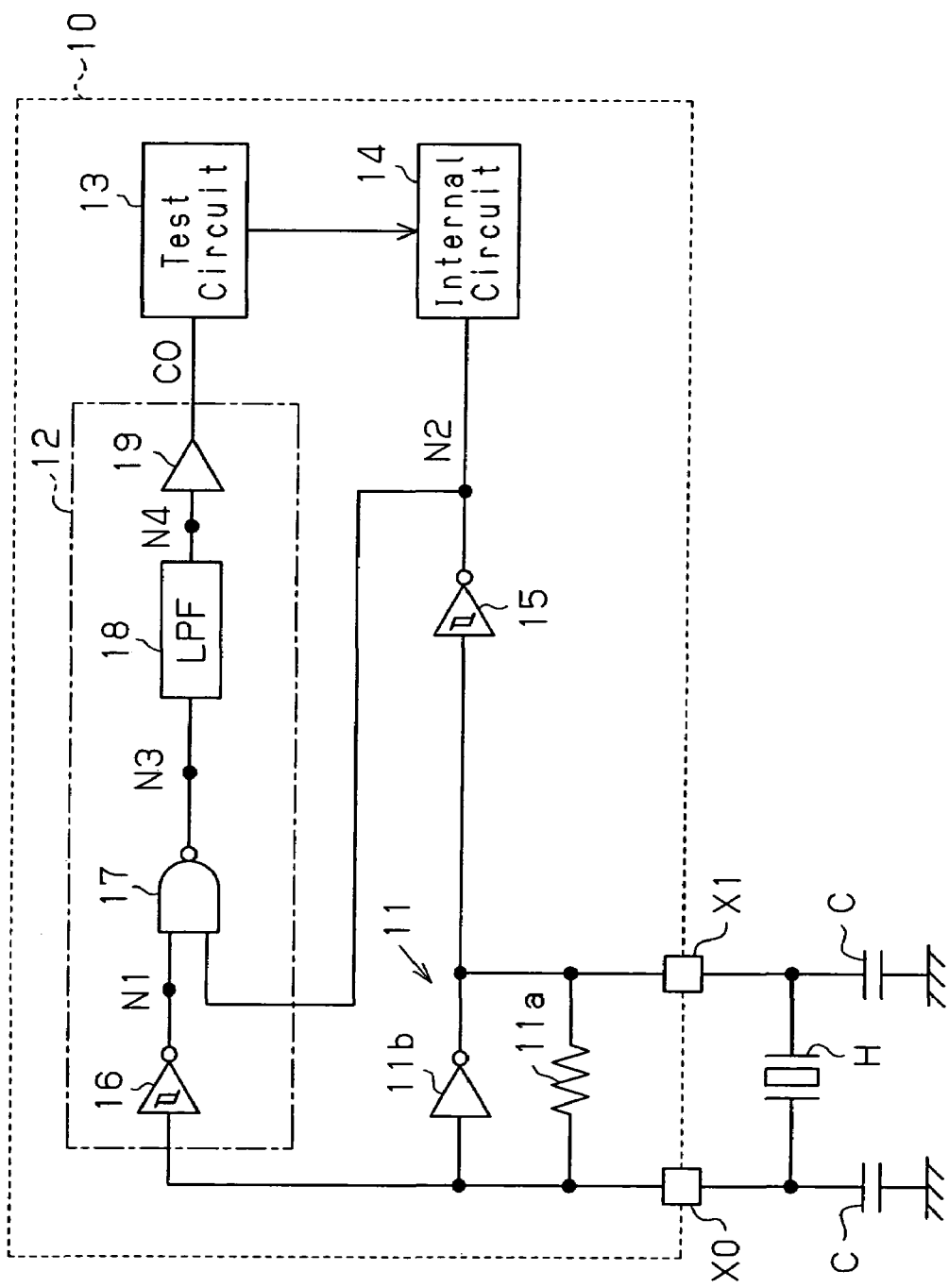
FIG. 2 is a schematic diagram of a semiconductor integrated circuit device according to a first embodiment of the present invention.

As shown in FIG. 2, the semiconductor integrated circuit device 10 includes an oscillator circuit 11, a mode detection circuit 12, a test circuit 13, and an internal circuit 14.

The oscillator circuit 11 includes a resistor 11a and an inverter circuit 11b that are connected in parallel with a pair of oscillator terminals X0 and X1. The oscillator terminals X0 and X1 are external terminals. The inverter circuit 11b is a gate circuit having a high resistance. A crystal oscillator H is connected between the oscillator terminals X0 and X1. The two terminals (oscillator terminals X0 and X1) of the crystal oscillator H are each connected to a low-potential power supply, via a pair of capacitors C. The oscillator circuit 11 and the crystal oscillator H generate a system clock signal having a predetermined oscillation frequency. The system clock signal is provided to the internal circuit 14 via an inverter circuit 15. The internal circuit 14 operates in accordance with the system clock signal.

The mode detection circuit 12 includes an inverter circuit 16, a NAND circuit 17, a low pass filter (LPF) 18, and a comparator 19. The mode detection circuit 12 detects a signal level at each of the oscillator terminals X0 and X1, and provides the test circuit 13 with a mode determination signal (detection signal) according to the detected signal level.

The NAND circuit 17 has a first input terminal connected to the oscillator terminal X0 via the inverter circuit 16, and a second input terminal connected to the oscillator terminal X1 via the inverter circuit 15. Each of the inverter circuit 15 and the inverter circuit 16 is a hysteresis inverter circuit having hysteresis characteristics.

An output terminal of the NAND circuit 17 is connected to an input terminal of the LPF 18. An output terminal of the LPF 18 is connected to an input terminal of the comparator 19. An output terminal of the comparator 19 is connected to the test circuit 13. The test circuit 13 is provided with an output signal of the comparator 19 as a determination signal CO indicating either the normal operation mode or the test mode. When the determination signal CO provided by the mode detection circuit 12 indicates the test mode, the test circuit 13 generates a test signal having a predetermined pattern according to the determination signal CO, and provides the internal circuit 14 with the test signal.

Figure 3:
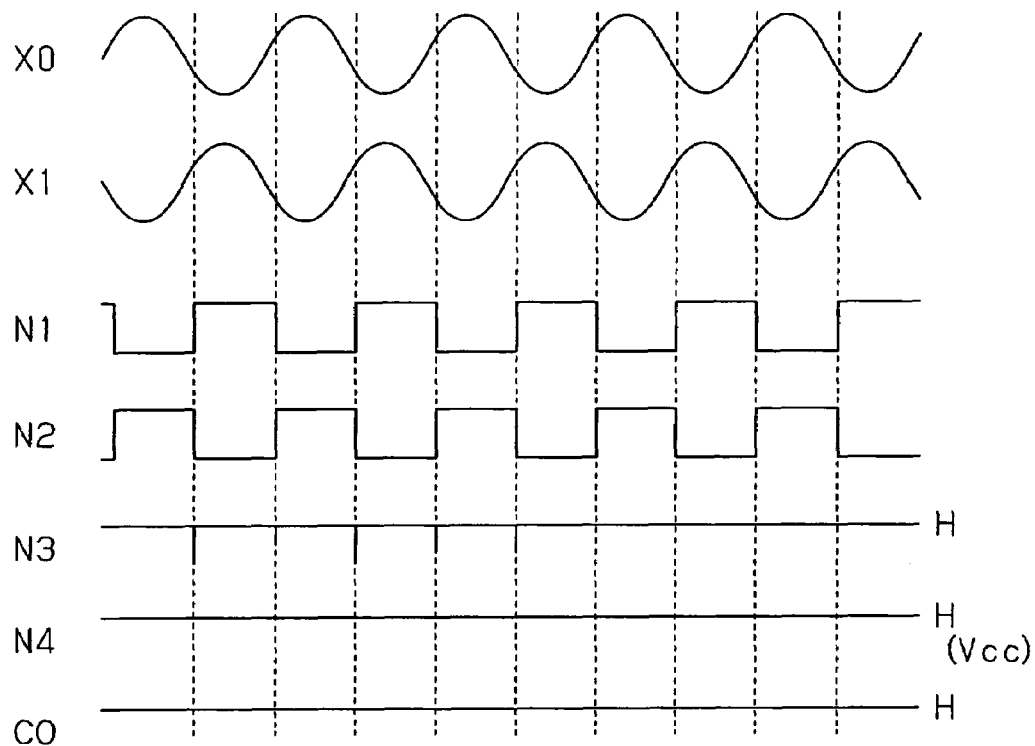
FIG. 3 is a waveform chart showing the normal operation of the semiconductor integrated circuit device of FIG. 2.
Figure 4:
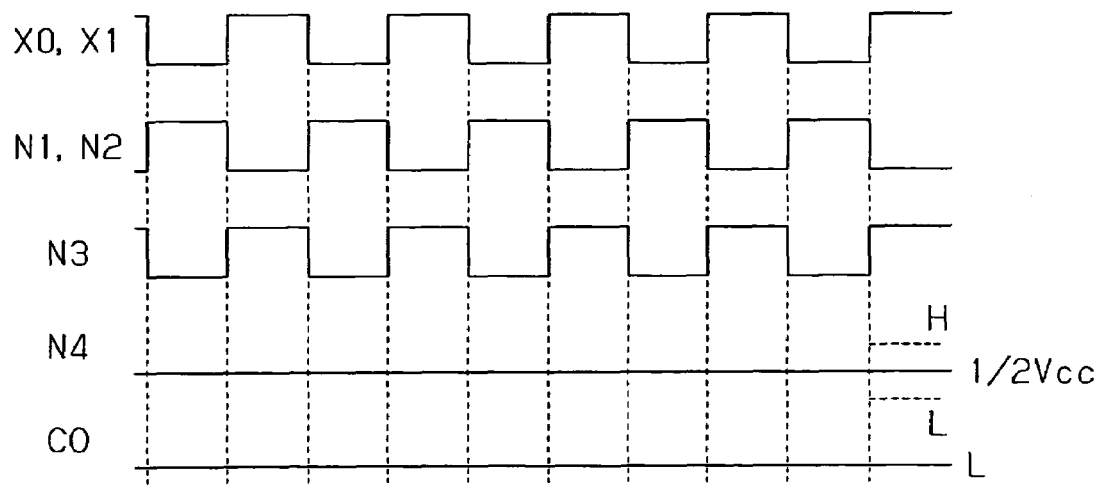
FIG. 4 is a waveform chart showing the test operation of the semiconductor integrated circuit device of FIG. 2.

FIG. 3 is a waveform chart showing the operation of the semiconductor integrated circuit device 10 in the normal operation mode. FIG. 4 is a waveform chart showing the operation in the test mode. Each waveform chart shows the signal level at each of the oscillator terminals X0 and X1, an output node N1 of the inverter circuit 16, an output node N2 of the inverter circuit 15, an output node N3 of the NAND circuit 17, and an output node N4 of the LPF 18, and the signal level of the determination signal CO.

The following first describes the normal operation of the semiconductor integrated circuit device 10.

As shown in FIGS. 2 and 3, with the use of the crystal oscillator H, a first and second oscillation signals having phases opposite to each other and having substantially sinusoidal waveforms are generated in the oscillator terminals X0 and X1 respectively. The first oscillation signal, which is generated in the oscillator terminal X0 with the use of the crystal oscillator H, is amplified in the inverter circuit 11b. The amplified first oscillation signal is provided, as a system clock signal, to the internal circuit 14 via the inverter circuit 15.

The inverter circuit 16 outputs a first inversion signal, which is obtained by inverting the signal level of the first oscillation signal generated in the oscillator terminal X0, to its output node N1. The inverter circuit 15 outputs a second inversion signal, which is obtained by inverting the signal level of the second oscillation signal generated in the oscillator terminal X1, to its output node N2. When the first inversion signal at the output node N1 of the inverter circuit 16 goes high ("H") level, the second inversion signal at the output node N2 of the inverter circuit 15 goes low ("L") level. When the first inversion signal at the output node N1 of the inverter circuit 16 goes "L" level, the second inversion signal at the output node N2 of the inverter circuit 15 goes "H" level.

In this way, one of the input terminals of the NAND circuit 17 is provided with a "L" level input signal. Thus, a "H" level output signal is generated in the output node N3 of the NAND circuit 17. The timing at which the output level is inverted in each of the inverter circuits 15 and 16 may slightly differ depending on their circuit characteristics. When the timing differs, noise at "L" level may appear in the output node N3 of the NAND circuit 17. Such noise is removed by the LPF 18. As a result, the output node N4 of the LPF 18 is maintained at "H" level (voltage Vcc of a high-potential power supply in this case). The comparator 19 compares the signal level at the node N4 with a reference level (specifically about ⅔ Vcc), and provides the test circuit 13 with a "H" level determination signal CO, which is the comparison result. The test circuit 13 determines that the semiconductor integrated circuit device 10 is in the normal operation mode based on the "H" level determination signal CO, and does not execute the test operation.

Figure 5:
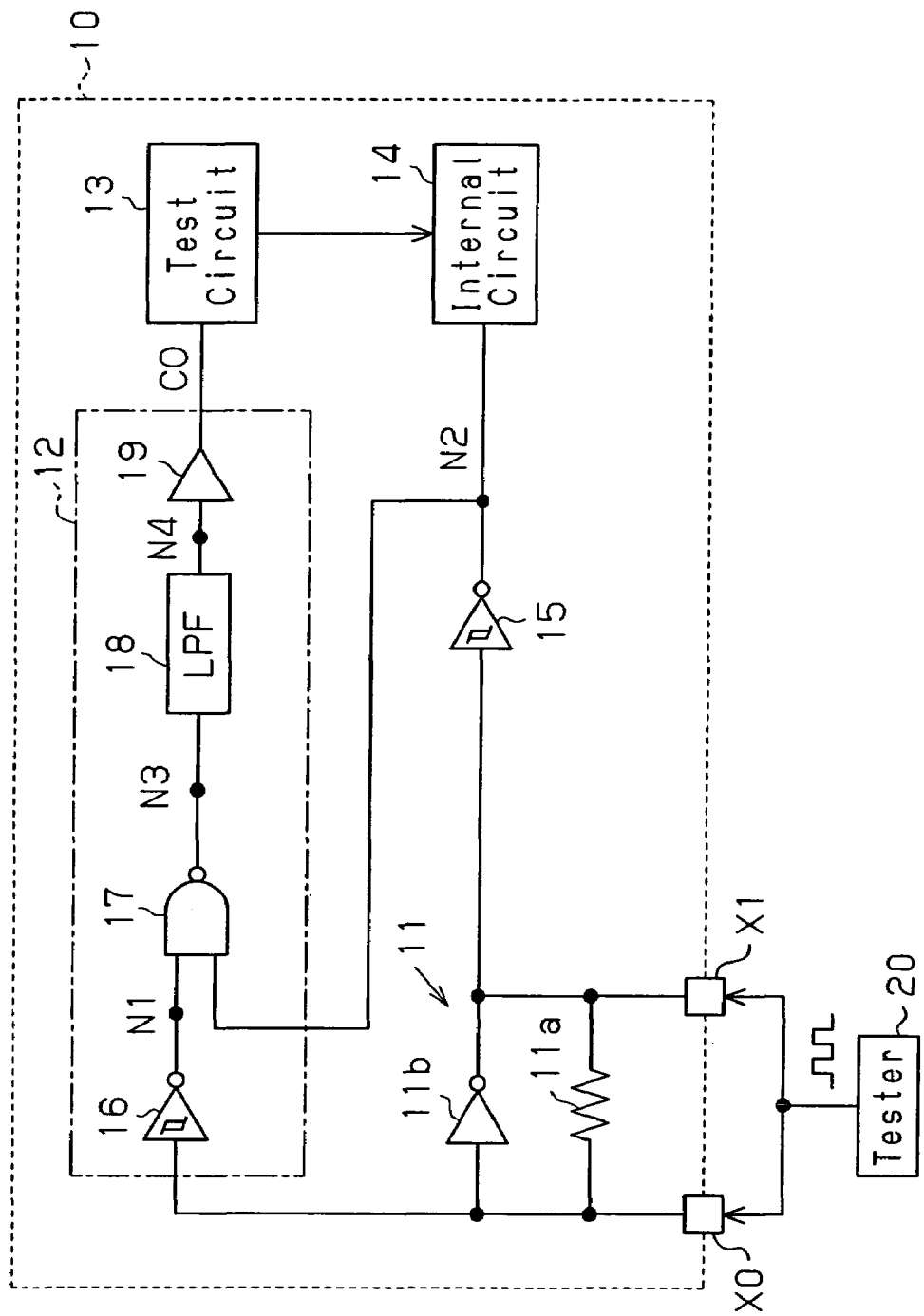
FIG. 5 is a schematic diagram of the semiconductor integrated circuit device of FIG. 2 to which a tester is connected.

The following describes the test operation of the semiconductor integrated circuit device 10. At the time of testing, an LSI tester 20 is connected to the oscillator terminals X0 and X1 as shown in FIG. 5. As shown in FIGS. 4 and 5, the LSI tester 20 provides the oscillator terminals X0 and X1 with a first and second input signals having the same phase, respectively. Each of the first and second input signals is a pulse signal with a "H" level period and a "L" level period being substantially equal (a signal with a duty ratio of 50%). The second input signal is provided, as a system clock signal, to the internal circuit 14 via the inverter circuit 15.

Here, the inverter circuit 11b having a high resistance in the oscillator circuit 11 is negligible. Thus, the inverter circuit 16 and the inverter circuit 15 are provided with the first and second input signals having the same phase, respectively. The first input signal is inverted by the inverter circuit 16, so that an inverted first input signal is generated in the output node N1. The second input signal is inverted by the inverter circuit 15, so that an inverted second input signal is generated in the output node N2. When both the output nodes N1 and N2 are at "H" level, the output node N3 of the NAND circuit 17 is set at "L" level. When both the output nodes N1 and N2 are at "L" level, the output node N3 of the NAND circuit 17 is set at "H" level. An output signal of the NAND circuit 17 has a duty ratio of 50%, based on the first and second input signals of the LSI tester 20. As a result, the signal level at the output node N4 of the LPF 18 is lowered and is set at a level that falls between "H" level and "L" level (about ½ Vcc). In other words, the LPF 18 smoothes the signal level of the output signal (pulse signal) of the NAND circuit 17.

The comparator 19 compares the signal level at the node N4 with a reference level (about ⅔ Vcc), and provides the test circuit 13 with a "L" level determination signal (detection signal) CO, which is the comparison result. The test circuit 13 determines that the semiconductor integrated circuit device 10 is in the test mode based on the "L" level determination signal. The test circuit 13 generates a predetermined test signal and operates the internal circuit 14 based on the test signal, to check whether the internal circuit 14 operates properly.

The semiconductor integrated circuit device 10 according to the first embodiment has the following advantages.

(1) The mode detection circuit 12 detects that the oscillator terminals X0 and X1 are respectively provided with the first and second input signals having the same phase by the LSI tester 20, and generates a "L" level determination signal CO for setting the test mode. In this case, the test circuit 13 determines that the semiconductor integrated circuit device 10 is in the test mode, based on the "L" level determination signal CO, and provides the internal circuit 14 with a system clock signal corresponding to a frequency of the second input signal. In this way, the oscillator terminals X0 and X1 in the semiconductor integrated circuit device 10 can be used not only to operate the oscillator circuit 11 but also to set the test mode. Thus, the semiconductor integrated circuit device 10 can set the test mode for testing the operation of the internal circuit 14 without being required to have external terminals specially provided for testing purposes (test terminals). An increase in the number of terminals of the semiconductor integrated circuit device 10 is prevented. As a result, the semiconductor integrated circuit device 10 is downsized, and its manufacturing cost is reduced.

(2) A typical microcontroller has oscillator terminals X0 and X1. By simply adding the function of a test terminal to the oscillator terminals X0 and X1, therefore, an increase in the number of terminals of the semiconductor integrated circuit device 10 is prevented. In this way, the semiconductor integrated circuit device 10 according to the present embodiment is practical for use.

Figure 6:
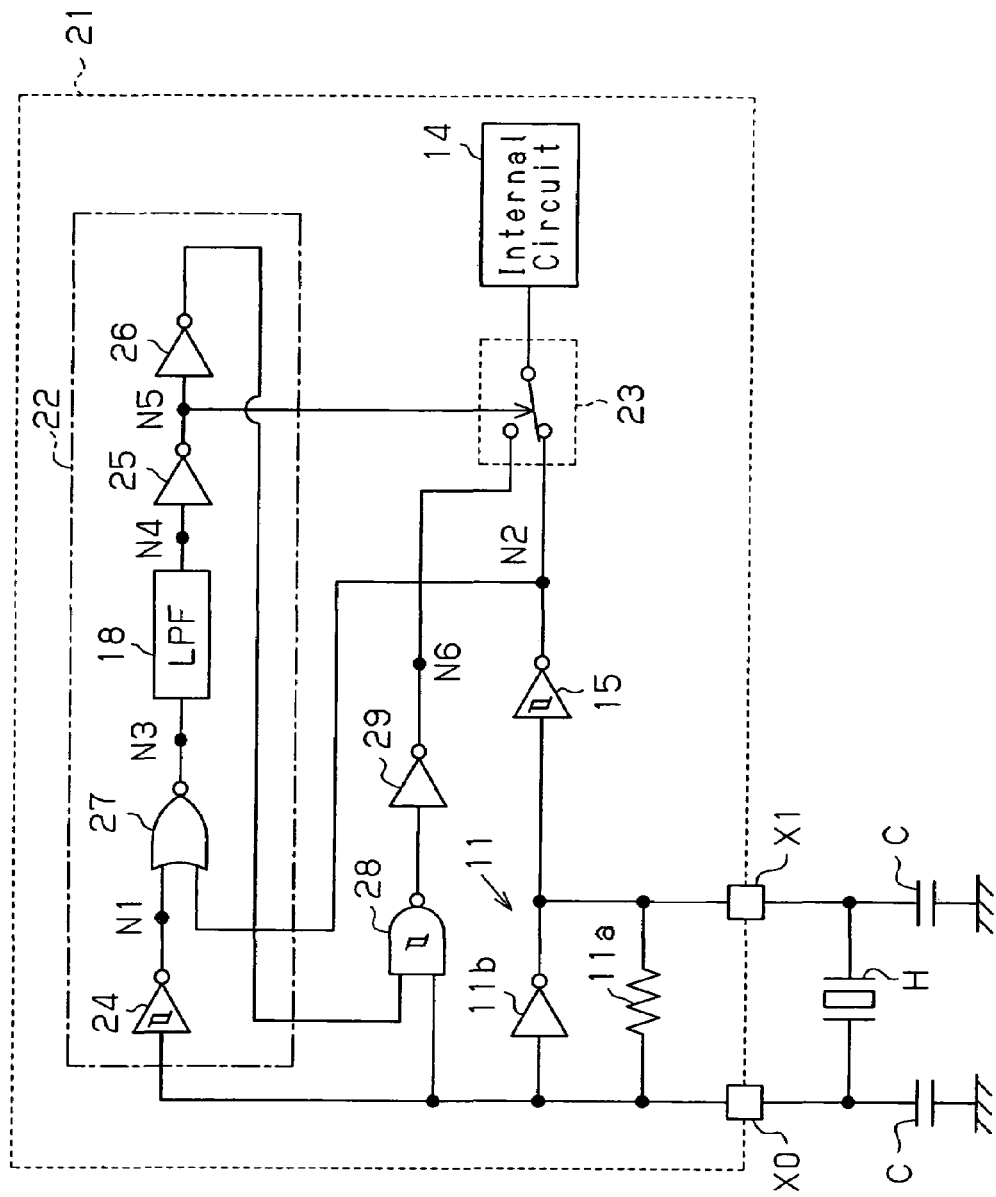
FIG. 6 is a schematic diagram of a semiconductor integrated circuit device according to a second embodiment of the present invention.

The following describes a semiconductor integrated circuit device 21 according to a second embodiment of the present invention. As shown in FIG. 6, the semiconductor integrated circuit device 21 according to the present embodiment includes an oscillator circuit 11, a mode detection circuit 22, a switch circuit 23, and an internal circuit 14.

In the normal operation mode of the semiconductor integrated circuit device 21, the oscillator circuit 11 and a crystal oscillator H connected to oscillator terminals X0 and X1 generate a system clock signal having a predetermined frequency (e.g., 1 MHz). The system clock signal is provided to the internal circuit 14 via an inverter circuit 15 and the switch circuit 23.

In the test operation of the semiconductor integrated circuit device 21, an LSI tester 20 is connected to the oscillator terminals X0 and X1. The LSI tester 20 provides the oscillator terminals X0 and X1 with a first and second input signals having the same phase, respectively. Each of the first and second input signals has a frequency (e.g., 50 MHz) higher than a frequency (1 MHz) of the system clock signal provided in the normal operation mode. The mode detection circuit 22 includes three inverter circuits 24, 25, and 26, a NOR circuit 27, and an LPF 18. The mode detection circuit 22 detects that the oscillator terminals X0 and X1 are provided with the first and second input signals having the same phase, respectively.

The inverter circuit 15, which transmits a system clock signal in the normal operation mode, is a gate circuit designed to operate at a low frequency of 1 MHz. This means that the inverter circuit 15 cannot transmit, as a system clock signal, the high frequency second input signal provided by the LSI tester 20. For this reason, the semiconductor integrated circuit device 21 according to the second embodiment includes a NAND circuit 28 and an inverter circuit 29 for transmitting a high frequency signal. The high frequency first input signal, provided by the LSI tester 20 via the NAND circuit 28 and the inverter circuit 19, is transmitted as a system clock signal.

In the mode detection circuit 22, the NOR circuit 27 has a first input terminal connected to the oscillator terminal X0 via the inverter circuit 24, and a second input terminal connected to the oscillator terminal X1 via the inverter circuit 15. An output terminal of the NOR circuit 27 is connected to an input terminal of the LPF 18. An output terminal of the LPF 18 is connected to an input terminal of the inverter circuit 25. An output terminal of the inverter circuit 25 is connected to an input terminal of the inverter circuit 26. The switch circuit 23 is provided with an output signal of the inverter circuit 25.

The NAND circuit 28 has a first input terminal for receiving an output signal of the inverter circuit 26, a second input terminal connected to the oscillator terminal X0, and an output terminal connected to the switch circuit 23 via the inverter circuit 29.

When the mode detection circuit 22 detects the test mode (when the oscillator terminals X0 and X1 are provided with the first and second input signals having the same phase, respectively), the output signal of the inverter circuit 25 controls the switch circuit 23, so that the inverter circuit 29 is connected to the internal circuit 14 via the switch circuit 23. Here, the LSI tester 20 provides the internal circuit 14 with a high frequency input signal via the NAND circuit 28, the inverter circuit 29, and the switch circuit 23. In the test mode, therefore, the internal circuit 14 operates in accordance with a system clock signal having a frequency higher than a frequency of the system clock signal provided in the normal operation mode.

Figure 7:
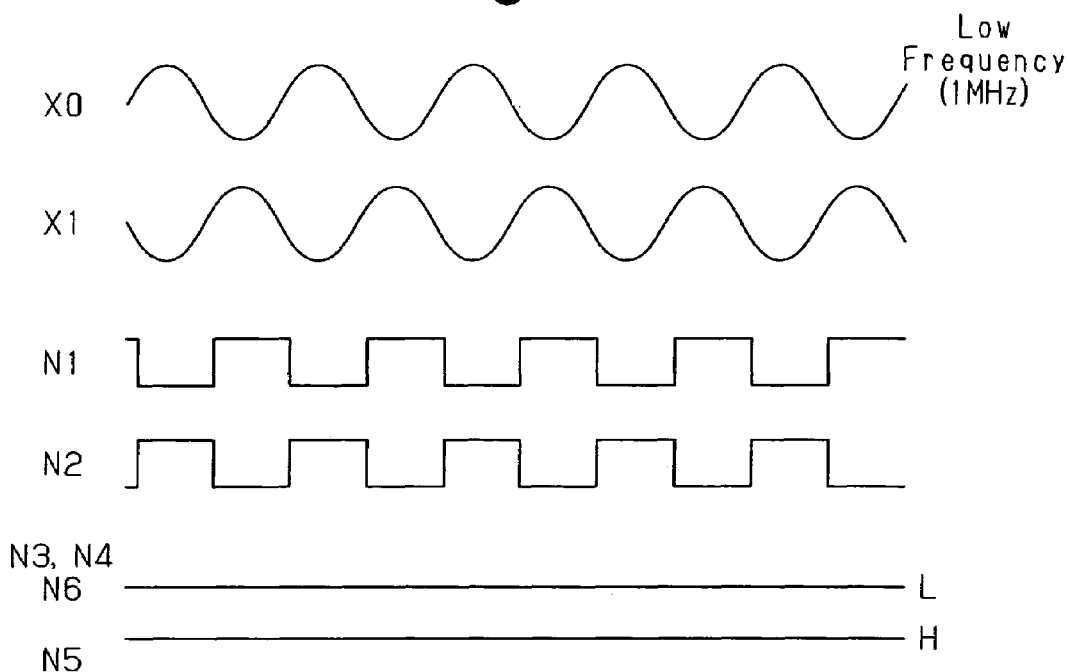
FIG. 7 is a waveform chart showing the normal operation of the semiconductor integrated circuit device of FIG. 6.
Figure 8:
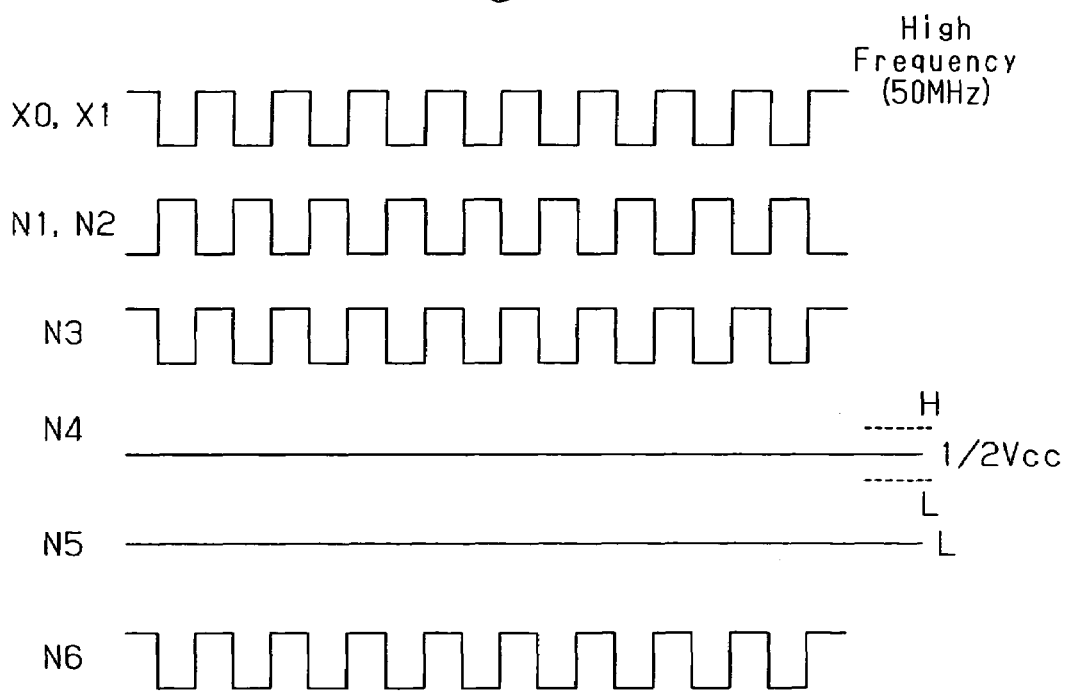
FIG. 8 is a waveform chart showing the test operation of the semiconductor integrated circuit device of FIG. 6.

FIG. 7 is a waveform chart showing the operation of the semiconductor integrated circuit device 21 in the normal operation mode. FIG. 8 is a waveform chart showing the operation in the test mode. Each waveform chart shows the signal level at each of the oscillator terminal X0 and X1, an output node N1 of the inverter circuit 24, an output node N2 of the inverter circuit 15, an output node N3 of the NOR circuit 27, an output node N4 of the LPF 18, an output node N5 of the inverter circuit 25, and an output node N6 of the inverter circuit 29.

The following first describes the normal operation of the semiconductor integrated circuit device 21.

As shown in FIGS. 6 and 7, with the use of the crystal oscillator H, a first and second oscillation signals having phases opposite to each other and having substantially sinusoidal waveforms are generated in the oscillator terminals X0 and X1 respectively. The inverter circuit 24 outputs an inversion signal, which is obtained by inverting the signal level of the first oscillation signal generated in the oscillator terminal X0, to the output node N1. The inverter circuit 15 outputs an inversion signal, which is obtained by inverting the signal level of the second oscillation signal generated in the oscillator terminal X1, to the output node N2. When the signal at the output node N1 of the inverter circuit 24 goes "H" level, the signal at the output node N2 of the inverter circuit 15 goes "L" level. When the signal at the output node N1 of the inverter circuit 24 goes "L" level, the signal at the output node N2 of the inverter circuit 15 goes "H" level.

In this way, one of the input terminals of the NOR circuit 27 is provided with a "H" level input signal. Thus, the output node N3 is set at "L" level, and the output node N4 of the LPF 18 is also set at "L" level. Here, the output node N5 of the inverter circuit 25 is set at "H" level, so that the first input terminal of the NAND circuit 28 is provided with a "L" level signal via the inverter circuit 26. The NAND circuit 28 always outputs a "H" level signal regardless of the signal level at its second input terminal (oscillator terminal X0), so that the output node N6 of the inverter circuit 29 is set at "L" level.

The switch circuit 23 is provided with a "H" level signal from the output node N5 of the inverter circuit 25 in the mode detection circuit 22, so that the transmission path of the switch circuit 23 is switched to the path to the inverter circuit 15. With this switching, an oscillation signal output from the oscillator circuit 11 is provided, as a system clock signal, to the internal circuit 14 via the inverter circuit 15 and the switch circuit 23.

The following describes the test operation of the semiconductor integrated circuit device 21.

As shown in FIG. 8, the LSI tester 20 provides the oscillator terminals X0 and X1 with the first and second input signals having the same phase, respectively. Each of the first and second input signals is a pulse signal having a frequency (50 MHz) higher than a frequency (1 MHz) of the clock signal provided in the normal mode.

In the test mode, the first and second input signals provided by the LSI tester 20 are inverted in the inverter circuits 15 and 24 respectively. Thus, the output nodes N1 and N2 have the same voltage level. When both the output nodes N1 and N2 are at "H" level, the output node N3 of the NOR circuit 27 is set at "L" level. When both the nodes N1 and N2 are at "L" level, the output node N3 of the NOR circuit 27 is set at "H" level. As a result, the signal level of the output node N4 of the LPF 18 increases and is set at a potential level (about ½ Vcc) that falls between "H" level and "L" level, and the output node N5 of the inverter circuit 25 is set at "L" level.

The inverter circuit 25 is a gate circuit composed of an NMOS (N-channel metal oxide semiconductor) transistor and a PMOS (P-channel metal oxide semiconductor) transistor. A threshold voltage of the inverter circuit 25 is set at about ⅓ Vcc by adjusting a driving power ratio of the two transistors. The inverter circuit 25 outputs a "L" level signal when its input level (signal level at the output node N4) increases to or above about ⅓ Vcc. The switch circuit 23 switches its transmission path to the path to the inverter circuit 29, in response to a "L" level signal provided by the inverter circuit 25.

The first input terminal of the NAND circuit 28 is provided with a "H" level signal via the inverter circuit 26. The NAND circuit 28 inverts the first input signal, which is provided from the oscillator terminal X0 to its second input terminal, to generate an inverted first input signal. The inverted first input signal generated by the NAND circuit 28 is further inverted by the inverter circuit 29.

The high frequency first input signal provided to the oscillator terminal X0 by the LSI tester 20 is transmitted to the output node N6 of the inverter circuit 29. The first input signal transmitted to the output node N6 is provided, as a system clock signal, to the internal circuit 14 via the switch circuit 23. Based on the system clock signal, whether the internal circuit 14 operates properly is checked.

The semiconductor integrated circuit device 21 according to the second embodiment has the following advantages.

The mode detection circuit 22 detects that the oscillator terminals X0 and X1 are respectively provided with the first and second input signals having the same phase, and controls the switch circuit 23 based on the detection result. This control causes the transmission path of a system clock signal to be switched, so that the internal circuit 14 is provided with a system clock signal having a higher frequency than an oscillation signal. Based on the high frequency system clock signal, whether the internal circuit 14 operates properly is checked. In this way, the oscillator terminals X0 and X1 can be used not only to operate the oscillator circuit 11 but also to switch the frequency of a system clock signal.

Figure 9:
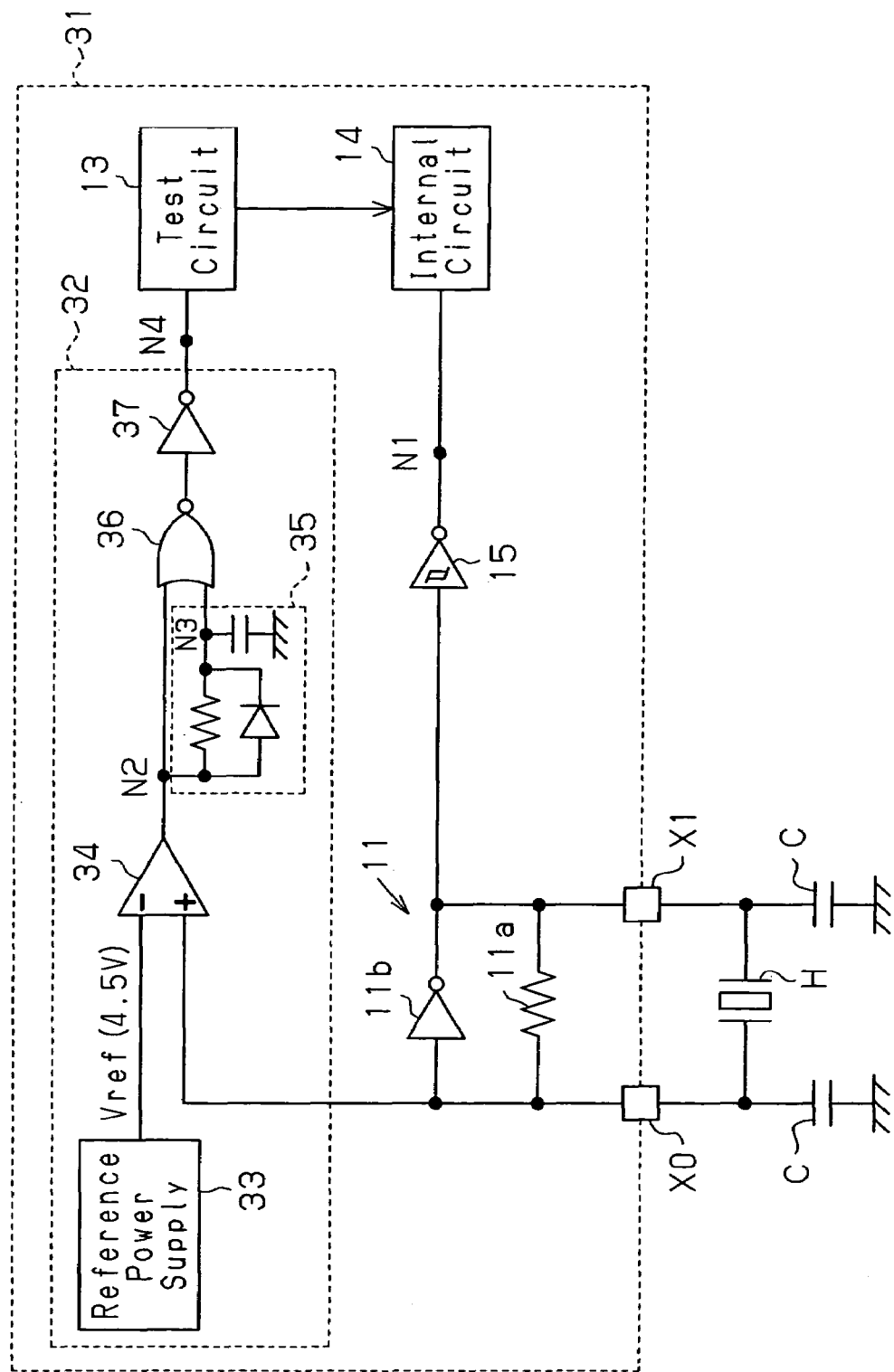
FIG. 9 is a schematic diagram of a semiconductor integrated circuit device according to a third embodiment of the present invention.

The following describes a semiconductor integrated circuit device 31 according to a third embodiment of the present invention. As shown in FIG. 9, the semiconductor integrated circuit device 31 includes an oscillator circuit 11, a test circuit 13, an internal circuit 14, and a mode detection circuit 32. The mode detection circuit 32 includes a reference power supply circuit 33, a comparator 34, a noise filter 35, a NOR circuit 36, and an inverter circuit 37. The comparator 34 has a non-inversion input terminal connected to an oscillator terminal X0, and an inversion input terminal connected to the reference power supply circuit 33. The comparator 34 compares the signal level at the oscillator terminal X0 with a reference voltage Vref (specifically, 4.5V) output from the reference power supply circuit 33. The comparator 34 outputs a "H" level signal when the signal level is higher than the reference voltage Vref, and outputs a "L" level signal when the signal level is lower than the reference voltage Vref.

The NOR circuit 36 has a first input terminal connected to an output terminal of the comparator 34, a second terminal connected to the output terminal of the comparator 34 via the noise filter 35, and an output terminal connected to the test circuit 13 via the inverter circuit 37. The noise filter 35 is composed of a resistor, a diode, and a capacitor.

Figure 10:
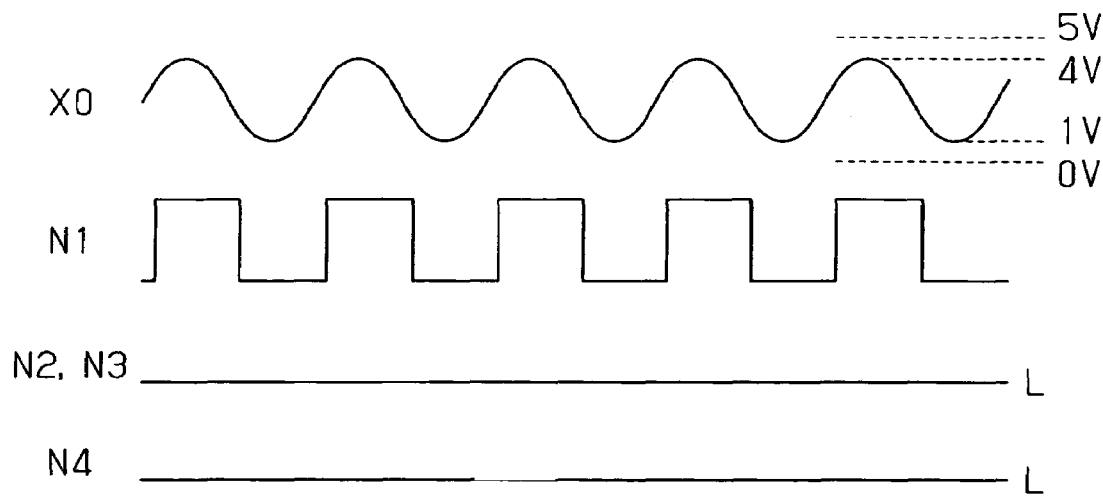
FIG. 10 is a waveform chart showing the normal operation of the semiconductor integrated circuit device of FIG. 9.
Figure 11:
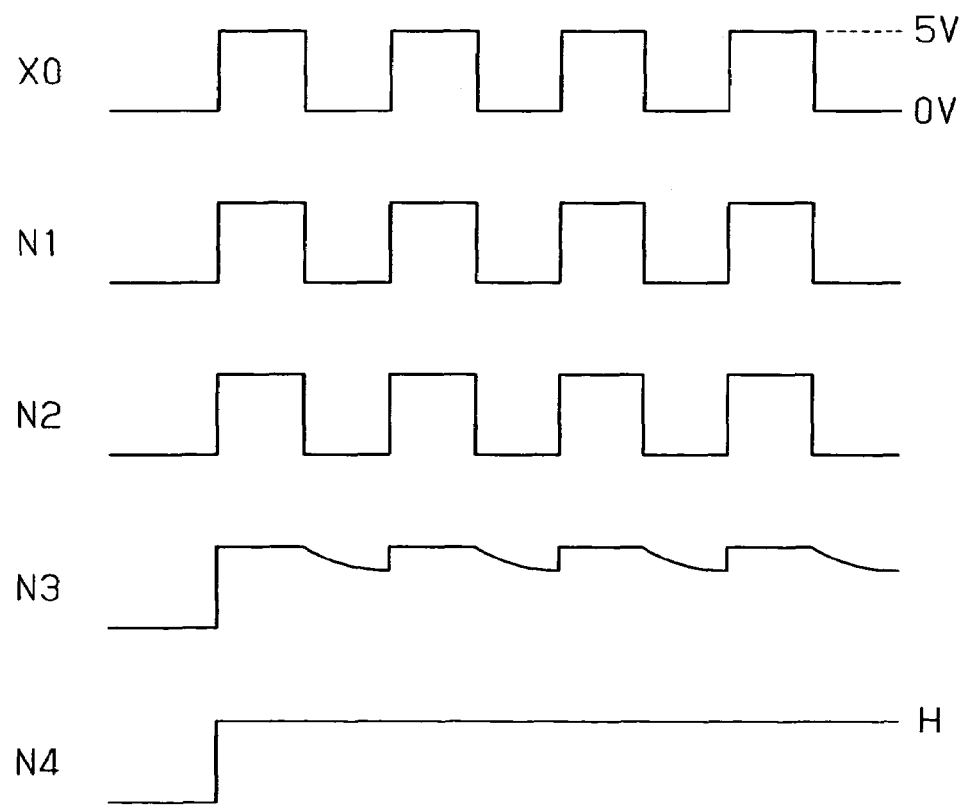
FIG. 11 is a waveform chart showing the test operation of the semiconductor integrated circuit device of FIG. 9.

FIG. 10 is a waveform chart showing the operation of the semiconductor integrated circuit device 31 in the normal operation mode. FIG. 11 is a waveform chart showing the operation in the test mode. Each waveform chart shows the signal level at each of the oscillator terminal X0, an output node N1 of the inverter circuit 15, an output node N2 of the comparator 34, an output node N3 of the noise filter 35, and an output node N4 of the inverter circuit 37.

As shown in FIG. 10, a first oscillation signal in the oscillator terminal X0 has an amplitude of potential levels ranging from 1 to 4V between a low-potential power supply voltage (0V) and a high-potential power supply voltage (5V). A second oscillation signal in an oscillator terminal X1 has an opposite phase to the phase of the first oscillation signal. The inverter circuit 15 inverts the second oscillation signal, and outputs the inverted second oscillation signal to the output node N1. The inverted second oscillation signal is provided to the internal circuit 14 as a system clock signal.

The first oscillation signal provided from the oscillator terminal X0 to the comparator 34 has a voltage lower than the reference voltage Vref. Thus, the output node N2 of the comparator 34 is maintained at "L" level. Here, the output node N3 of the noise filter 35 is also set at "L" level, so that the NOR circuit 36 outputs a "H" level signal. The output signal is inverted by the inverter circuit 37, so that the output node N4 is set at "L" level. The test circuit 13 determines that the semiconductor integrated circuit device 31 is in the normal operation mode based on the "L" level signal provided by the mode detection circuit 32 (inverter circuit 37), and does not execute the test operation.

In the test operation of the semiconductor integrated circuit device 31, an LSI tester 20 is connected to the oscillator terminal X0. As shown in FIG. 11, the LSI tester 20 provides the oscillator terminal X0 with an input signal having a predetermined frequency. The input signal is inverted by the inverter circuit 11b, and is further inverted by the inverter circuit 15. Thus, the signal output from the inverter circuit 15 to the output node N1, which has the same phase as the input signal of the oscillator terminal X0, is provided to the internal circuit 14 as a system clock signal.

A "H" level input signal provided to the oscillator terminal X0 by the LSI tester 20 has a voltage level of 5V, which is higher than the reference voltage Vref (4.5V). The comparator 34 sets the output node N2 at "H" level when the input signal is at "H" level, and sets the output node N2 at "L" level when the input signal is at "L" level.

When the output node N2 is at "H" level, the "H" level signal is transmitted to the output node N3 via the diode of the noise filter 35. When the output node N2 is at "L" level, the "L" level signal is cut off by the diode of the noise filter 35. The potential level of the output node N3 gradually decreases according to a time constant predetermined by the capacitor and the resistor. As a result, the NOR circuit 36 outputs a "L" level output signal. The output signal is inverted by the inverter circuit 37, so that the output node N4 is set at "H" level.

The test circuit 13 determines that the semiconductor integrated circuit device 31 is in the test mode based on the "H" level detection signal provided by the mode detection circuit 32 (inverter circuit 37), and provides the internal circuit 14 with a predetermined test signal. The test circuit 13 checks whether the internal circuit 14 operates properly based on the test signal.

The semiconductor integrated circuit device 31 according to the third embodiment has the following advantages.

The LSI tester 20 provides the oscillator terminal X0 with an input signal having a higher level than an amplitude level of an oscillation signal provided in the normal operation mode. The mode detection circuit 32 detects the input signal provided by the LSI tester 20, and provides the test circuit 13 with a "H" level detection signal. The test circuit 13 determines that the semiconductor integrated circuit device 31 is in the test mode, based on the detection signal. Thus, the semiconductor integrated circuit device 31 can set the test mode for testing the operation of the internal circuit 14, without being required to have a test terminal.

Figure 12:
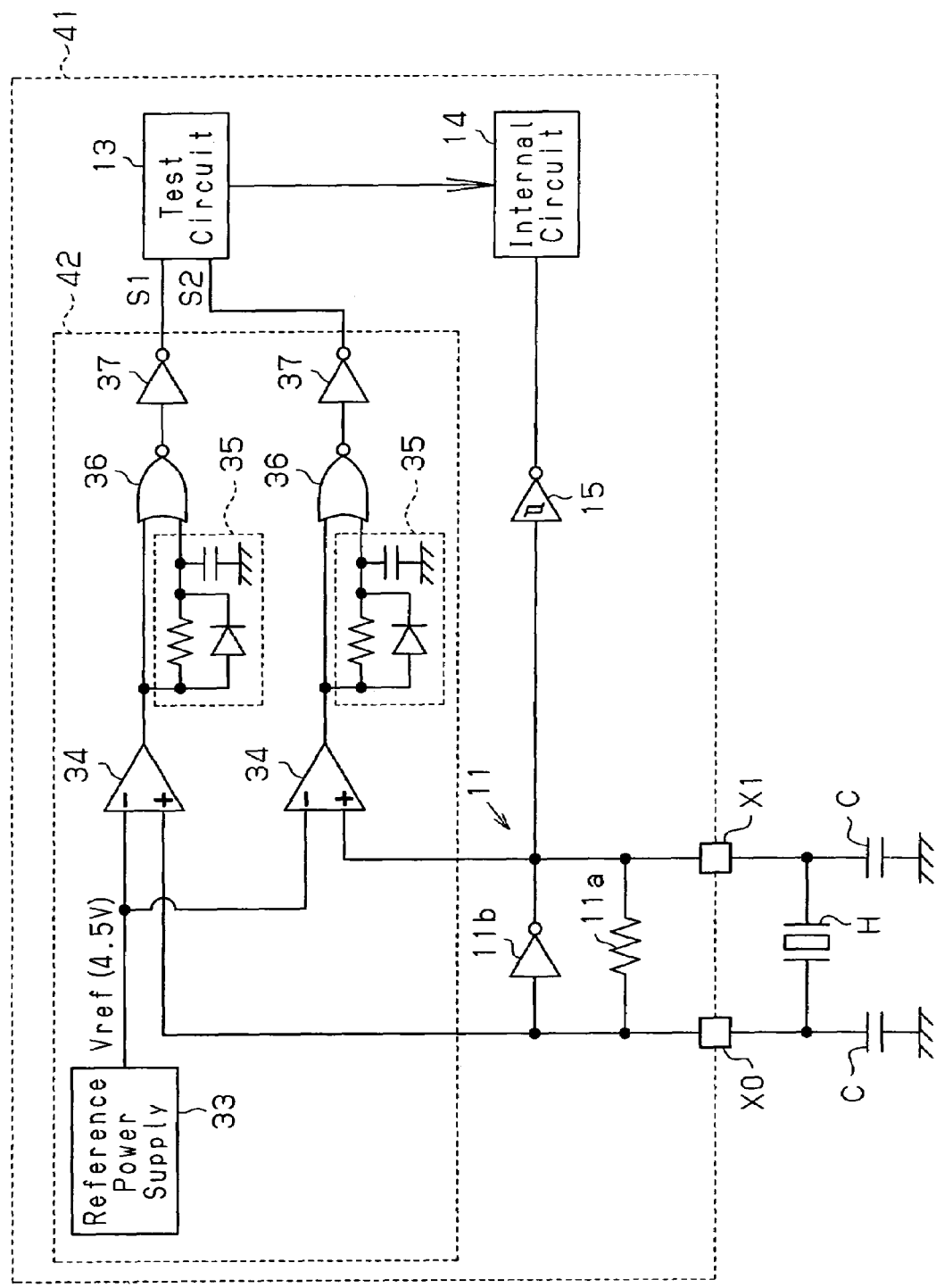
FIG. 12 is a schematic diagram of a semiconductor integrated circuit device according to a fourth embodiment of the present invention.

The following describes a semiconductor integrated circuit device 41 according to a fourth embodiment of the present invention. As shown in FIG. 12, the semiconductor integrated circuit device 41 according to the fourth embodiment includes a mode detection circuit 42, which differs from the mode detection circuit 32 according to the third embodiment. The mode detection circuit 42 independently detects the level of each of a first and second input signals provided to oscillator terminals X0 and X1 respectively.

The mode detection circuit 42 includes a reference power supply circuit 33, two comparators 34, two noise filters 35, two NOR circuits 36, and two inverter circuits 37. The first comparator 34 has a non-inversion input terminal connected to the oscillator terminal X0, and an inversion input terminal connected to the reference power supply circuit 33. The second comparator 34 has a non-inversion input terminal connected to the oscillator terminal X1, and an inversion input terminal connected to the reference power supply circuit 33. The connection of the comparator 34, the noise filter 35, the NOR circuit 36, and the inverter circuit 37 is the same as the connection of the corresponding components of the mode detection circuit 32 according to the third embodiment.

The mode detection circuit 42 detects the level of each of the first and second input signals provided to the oscillator terminals X0 and X1 respectively, by controlling the level of each of the first and second input signals. The mode detection circuit 42 then provides the test circuit 13 with detection signals S1 and S2 according to the detection results.

For example, when the oscillator terminal X0 is provided with the first input signal with an amplitude of 0 to 5V and the oscillator terminal X1 is provided with the second input signal with an amplitude of 1 to 4V by the LSI tester 20, the mode detection circuit 42 generates a "H" level detection signal S1 and a "L" level detection signal S2. In this case, the test circuit 13 determines that the semiconductor integrated circuit device 41 is in a first test mode based on the signal level combination of these detection signals, and provides the internal circuit 14 with a test signal having a test pattern according to the first test mode.

When the oscillator terminal X0 is provided with the first input signal with an amplitude of 1 to 4V and the oscillator terminal X1 is provided with the second input signal with an amplitude of 0 to 5V by the LSI tester 20, the mode detection circuit 42 generates a "L" level detection signal S1 and a "H" level detection signal S2. In this case, the test circuit 13 determines that the semiconductor integrated circuit device 41 is in a second test mode based on the signal level combination of these detection signals, and provides the internal circuit 14 with a test signal having a test pattern according to the second test mode.

When the oscillator terminals X0 and X1 are respectively provided with the first and second input signals both with an amplitude of 0 to 5V by the LSI tester 20, the mode detection circuit 42 generates "H" level detection signals S1 and S2. In this case, the test circuit 13 determines that the semiconductor integrated circuit device 41 is in a third test mode based on the signal level combination of these detection signals, and provides the internal circuit 14 with a test signal having a test pattern according to the third test mode.

The semiconductor integrated circuit device 41 according to the fourth embodiment has the following advantages.

The mode detection circuit 42 independently detects the level of each of the first and second input signals in the oscillator terminals X0 and X1, and provides the test circuit 13 with detection signals S1 and S2 according to these detection results. The test circuit 13 detects one of a plurality of modes (normal operation mode and three test modes) based on the signal level combination of the detection signals S1 and S2. Thus, the semiconductor integrated circuit device 41 can set a plurality of test modes without being required to have test terminals.

Figure 13:
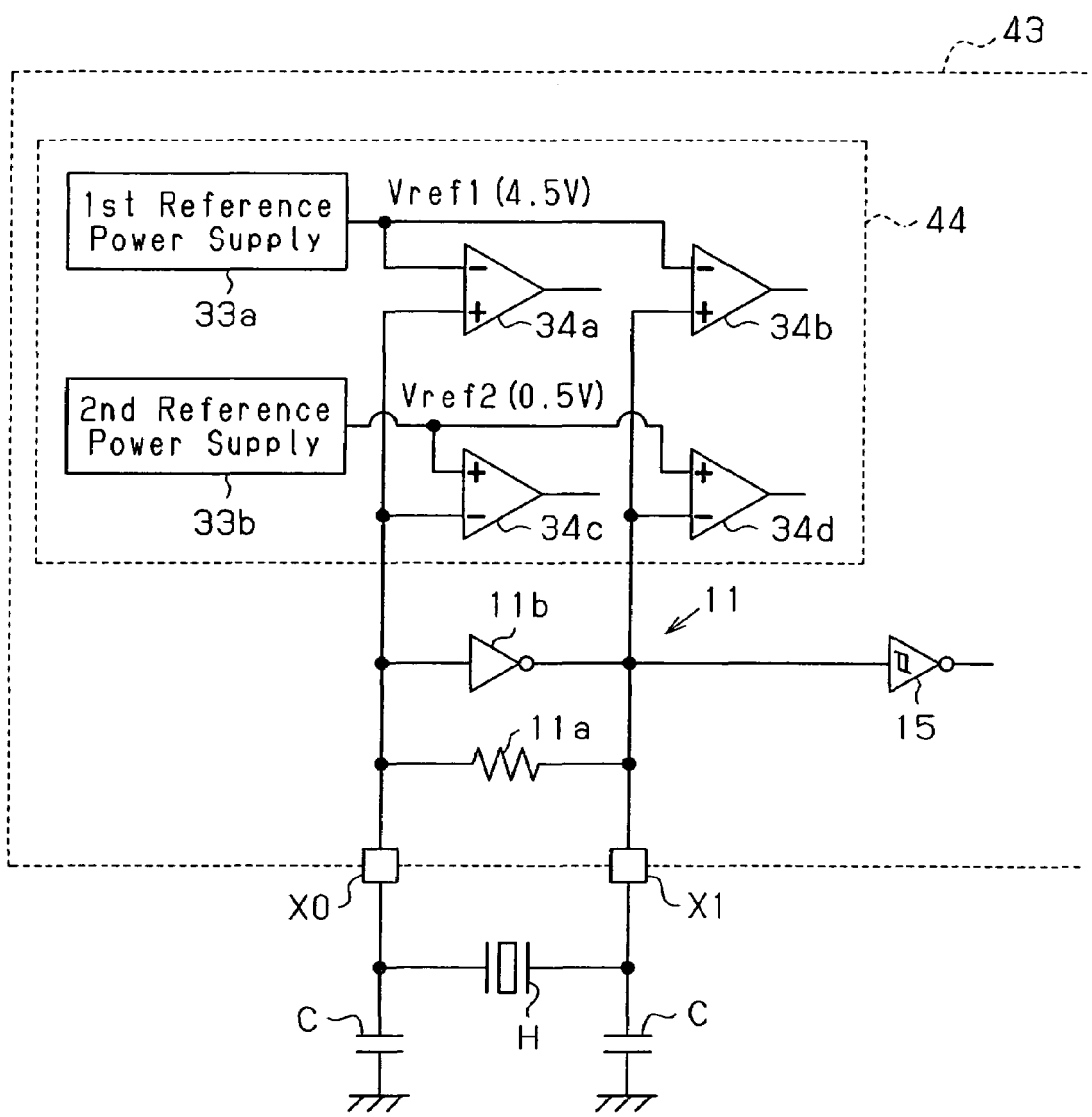
FIG. 13 is a schematic diagram of a semiconductor integrated circuit device according to a fifth embodiment of the present invention.

The following describes a semiconductor integrated circuit device 43 according to a fifth embodiment of the present invention. As shown in FIG. 13, the semiconductor integrated circuit device 43 includes a mode detection circuit 44, which differs from the mode detection circuit 42 according to the fourth embodiment. The mode detection circuit 44 includes a first and second reference power supply circuits 33a and 33b, and a first to fourth comparators 34a, 34b, 34c, and 34d. Although not shown in FIG. 13, the mode detection circuit 44 includes a plurality of noise filters, NOR circuits, and inverter circuits corresponding to the comparators 34a to 34d. These circuits correspond to the noise filters 35, the NOR circuits 36, and the inverter circuits 37 shown in FIG. 12.

The first comparator 34a has a non-inversion input terminal connected to an oscillator terminal X0, and an inversion input terminal connected to the first reference power supply circuit 33a. The first comparator 34a compares the signal level at the oscillator terminal X0 with a first reference voltage Vref1 (4.5V) output from the first reference power supply circuit 33a. The first comparator 34a outputs a "H" level signal when the signal level is higher than the reference voltage Vref1, and outputs a "L" level signal when the signal level is lower than the reference voltage Vref1.

The second comparator 34b has a non-inversion input terminal connected to an oscillator terminal X1, and an inversion input terminal connected to the first reference power supply circuit 33a. The second comparator 34b compares the signal level at the oscillator terminal X1 with the first reference voltage Vref1. The second comparator 34b outputs a "H" level signal when the signal level is higher than the reference voltage Vref1, and outputs a "L" level signal when the signal level is lower than the reference voltage Vref1.

The third comparator 34c has an inversion input terminal connected to the oscillator terminal X0, and a non-inversion input terminal connected to the second reference power supply circuit 33b. The third comparator 34c compares the signal level at the oscillator terminal X0 with a second reference voltage Vref2 (0.5V) output from the second reference power supply circuit 33b. The third comparator 34c outputs a "H" level signal when the signal level is higher than the reference voltage Vref2, and outputs a "L" level signal when the signal level is lower than the reference voltage Vref2.

The fourth comparator 34d has an inversion input terminal connected to the oscillator terminal X1, and a non-inversion input terminal connected to the second reference power supply circuit 33b. The fourth comparator 34d compares the signal level at the oscillator terminal X1 with the second reference voltage Vref2. The fourth comparator 34d outputs a "H" level signal when the signal level is higher than the reference voltage Vref2, and outputs a "L" level signal when the signal level is lower than the reference voltage Vref2.

A test circuit 13 is provided with the comparison result of each of the comparators 34a to 34d in the mode detection circuit 44 via the corresponding noise filter, NOR circuit, and inverter circuit. Specifically, the test circuit 13 is provided with two detection signals in a combination that differs in signal level depending on whether the input signal of the oscillator terminal X0 has an amplitude of 1 to 4V, an amplitude of 1 to 5V, an amplitude of 0 to 4V, or an amplitude of 0 to 5V. In the same manner, the test circuit 13 is provided with two detection signals in a combination that differs in signal level by controlling the amplitude level of the input signal of the oscillator terminal X1. As a result, four detection signals are generated based on the comparison result of each of the comparators 34a to 34d. Based on the four detection signals, the test circuit 13 detects one of a plurality of test modes (16 test modes in this case). The test circuit 13 then provides an internal circuit 14 with a test signal having a pattern corresponding to the detected test mode, and checks whether the internal circuit 14 operates properly.

The semiconductor integrated circuit device 43 according to the fifth embodiment has the following advantages.

The mode detection circuit 44 can detect an input signal having a higher level than an amplitude level of a normal oscillation signal and an input signal having a lower level than an amplitude level of a normal oscillation signal, which are provided to the oscillator terminals X0 and X1 by the LSI tester 20. Based on the signal level combination of the detected input signals, the mode detection circuit 44 can set a plurality of (16) test modes.

Figure 14:
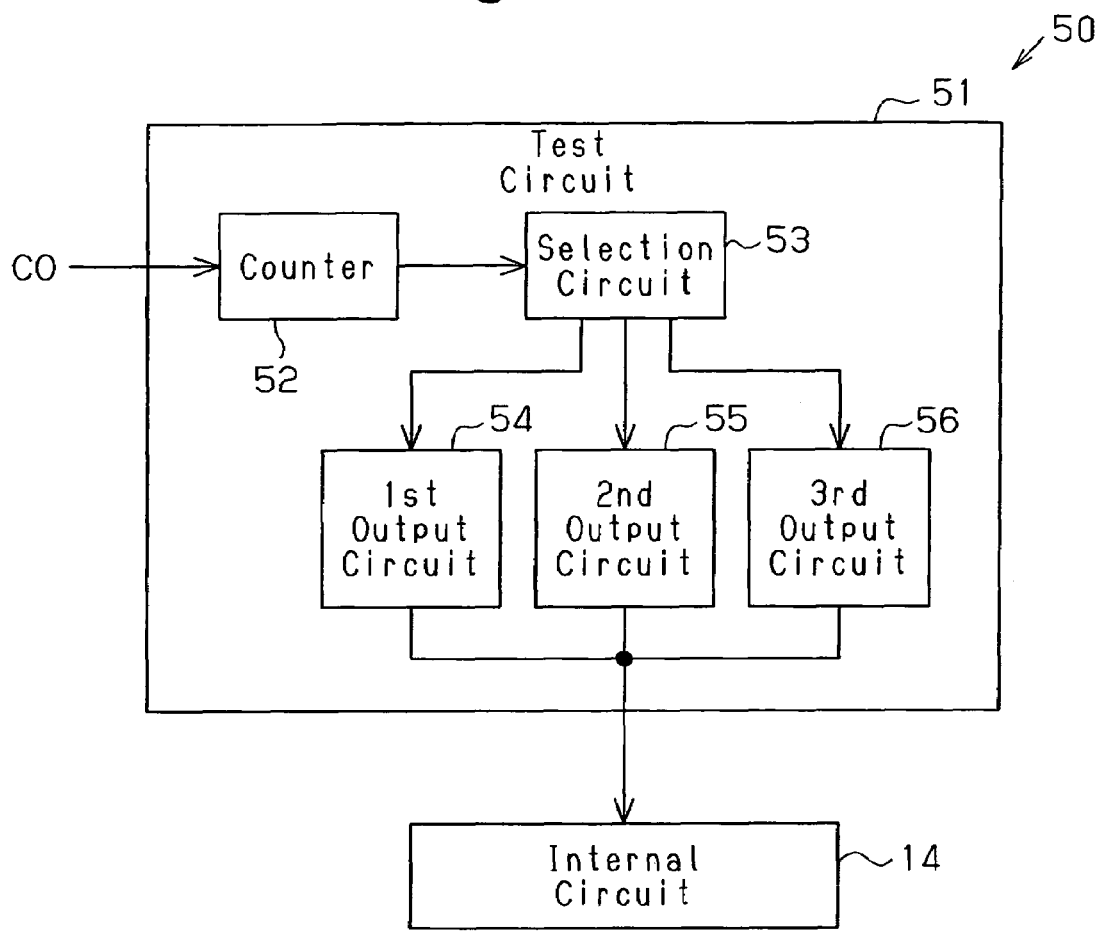
FIG. 14 is a schematic block diagram of a test circuit included in a semiconductor integrated circuit device according to a sixth embodiment of the present invention.

The following describes a semiconductor integrated circuit device 50 according to a sixth embodiment of the present invention. As shown in FIG. 14, the semiconductor integrated circuit device 50 includes a test circuit 51, an internal circuit 14, an oscillator circuit (not shown as being the same as the oscillator circuit 11 in the first embodiment), and a mode detection circuit (not shown as being the same as the mode detection circuit 12 in the first embodiment).

The test circuit 51 includes a counter 52, a selection circuit 53, and a first to third output circuits 54, 55 and 56. The test circuit 51 measures a period during which input signals having the same phase are being provided to the oscillator terminals X0 and X1 by an LSI tester 20, and sets a test mode according to the measured period.

Specifically, the LSI tester 20 may provide the oscillator terminals X0 and X1 with the input signals having the same phase only for a predetermined period, and after that, may provide the oscillator terminals X0 and X1 with input signals having phases opposite to each other. In this case, the mode detection circuit 12 generates a "L" level determination signal CO for the period during which the input signals having the same phase are being provided, and generates a "H" level determination signal CO once the input signals having the opposite phases are started to be provided. The counter 52 measures a period during which a "L" level determination signal (detection signal) is being output from the mode detection circuit 12. Based on the counter value of the counter 52, the selection circuit 53 selects one of the first to third output circuits 54 to 56, and outputs a test signal having a predetermined pattern from the selected output circuit.

By switching among the first to third output circuits 54 to 56 in this way, the test circuit 51 provides the internal circuit 14 with a test signal having a different pattern. The test circuit 51 operates the internal circuit 14 according to the test signal, to check whether the internal circuit 14 operates properly.

The semiconductor integrated circuit device 50 according to the sixth embodiment has the following advantages.

A period during which a "L" level determination signal CO is being output from the mode detection circuit 12 is measured. Based on the measured period, one of a plurality of test modes is set. Thus, the semiconductor integrated circuit device 50 sets a plurality of test modes without being required to have a test terminal. In this way, the package of the semiconductor integrated circuit device 50 is downsized.

It should be apparent to those skilled in the art that the present invention may be embodied in many other specific forms without departing from the spirit or scope of the invention. Particularly, it should be understood that the invention may be embodied in the following forms.

Figure 15:
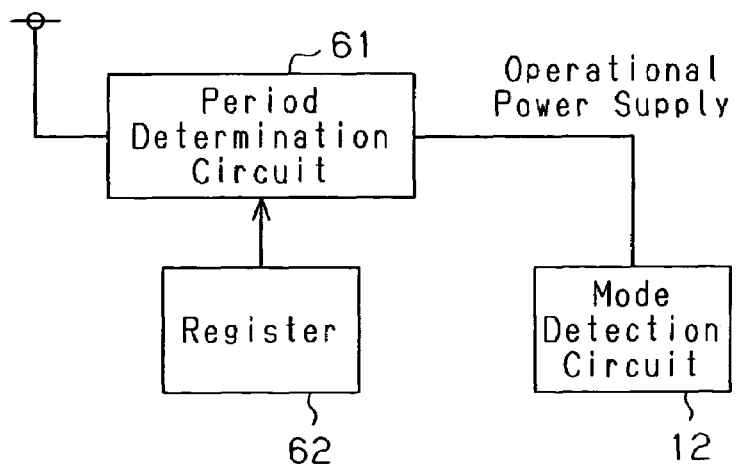
FIG. 15 is a schematic block diagram of a semiconductor integrated circuit device of another example.

In the above embodiments, the mode detection circuits 12, 22, 32, 42, and 44 may operate only for a predetermined detection period. Specifically, as shown in FIG. 15, a period determination circuit 61 may be connected between the mode detection circuit 12 and the power supply. The period determination circuit 61 may include, for example, a counter for measuring a period that elapses from when the semiconductor integrated circuit device 10 is activated. The period determination circuit 61 supplies operational power to the mode detection circuit 12 until a predetermined period elapses based on the counter value of the counter (until the counter value reaches a value set in the register 62). According to this structure, the mode detection circuit 12 consumes electric current only for a predetermined period after activation of the semiconductor integrated circuit device 10, and the consumption power of the semiconductor integrated circuit device 10 is reduced. The period determination circuit 61 may include a one-shot circuit, to supply operational power only for a predetermined period.

Figure 16:
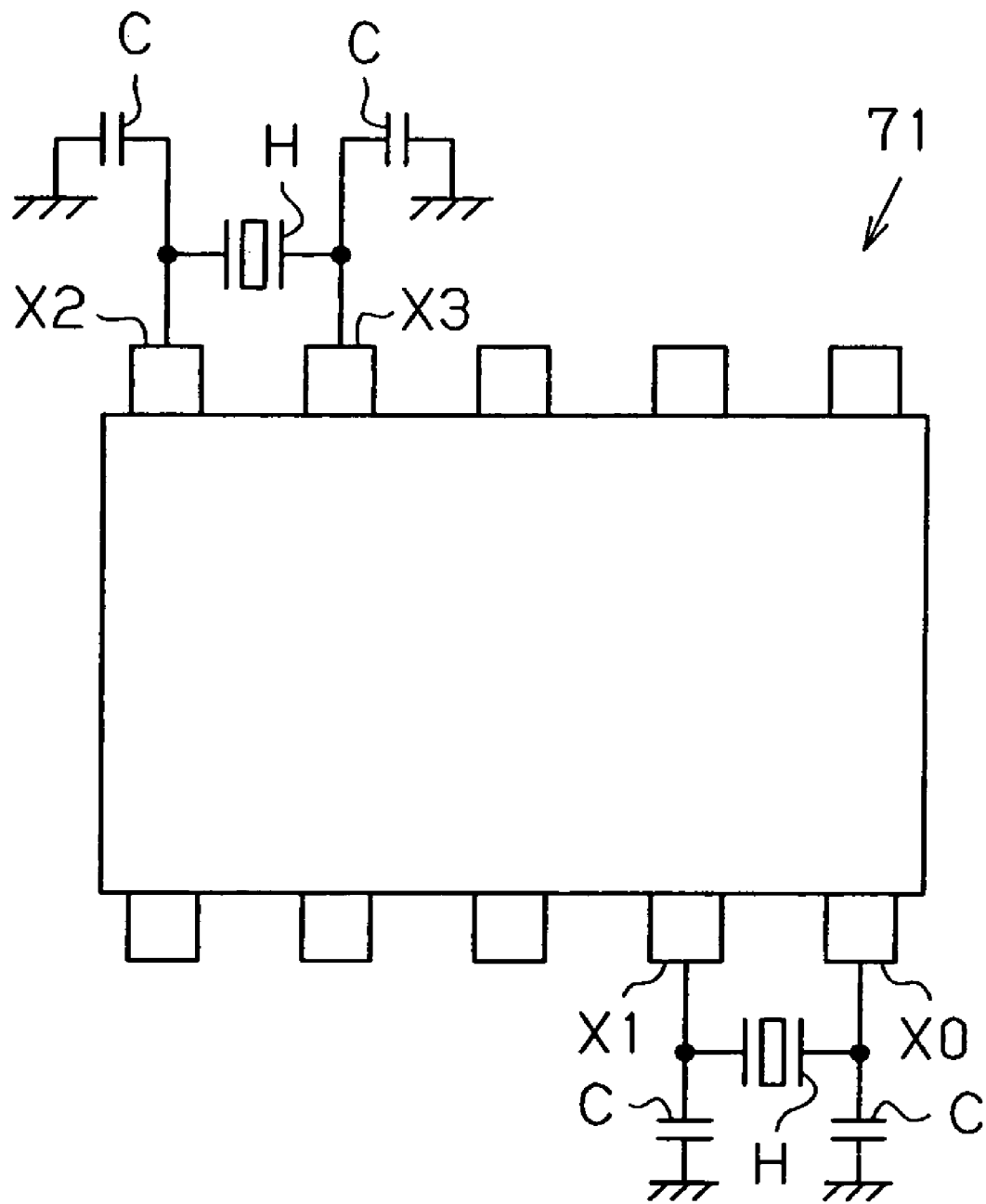
FIG. 16 is a schematic diagram of a semiconductor integrated circuit device of still another example.

As shown in FIG. 16, the present invention may be applied to a semiconductor integrated circuit device 71 having a pair of oscillator terminals X0 and X1 corresponding to a main-oscillator circuit, and a pair of oscillator terminals X2 and X3 corresponding to a sub-oscillator circuit. In this case, one mode detection circuit 12 may be provided for each pair of oscillator terminals, to set a test mode. According to this structure, a plurality of test modes can be set.

The mode detection circuit 12 according to the first embodiment may include an A/D comparator for reading an output voltage of the LPF 18 and determining the output level of the LPF 18, instead of the comparator 19.

The mode detection circuit 12 according to the first embodiment may include a circuit for detecting a pulse width at the output node N3 and detecting the test mode based on the pulse width, instead of the LPF 18 and the comparator 19.

The semiconductor integrated circuit devices 10, 21, 31, 41, and 43 according to the above embodiments may have test terminals. In this case, the number of test modes to be set can be increased by signal level combinations of input signals provided to the test terminals and input signals provided to the oscillator terminals X0 and X1.

In the above embodiments, when the test mode is set based on the signal level of input signals provided to the oscillator terminals X0 and X1, a predetermined one of a plurality of test modes may be selected by controlling an input signal provided to an external terminal other than the oscillator terminals.

In the above embodiments, instead of setting the test mode based on the detection result of the signal level of the input signals provided to the oscillator terminals X0 and X1, an operation mode other than the test mode may be set based on the detection result of the mode detection circuit 12.

In the mode detection circuits 12 and 22 according to the first and second embodiments, the logic of each gate circuit (the inverter circuit 16, the NOR circuit 17, etc.), which detects the input signals having the same phase provided to the oscillator terminals X0 and X1, may be changed appropriately.

In the above embodiments, instead of setting the test mode based on the signal level of the input signals provided to the oscillator terminals X0 and X1, the test mode may be set based on the pulse width of the input signals (duty ratio of the signals). Specifically, in the test mode, an input signal having a duty ratio different from a duty ratio of the input signal provided in the normal operation mode (signal with a duty ratio of 50%) may be provided by the LSI tester 20. The mode detection circuit may detect such a different duty ratio, and may provide the test circuit with a detection signal according to the detected duty ratio. According to this structure, too, the semiconductor integrated circuit device can set the test mode without being required to have test terminals.

The present invention may be applied to an embodiment in which a pair of communication terminals are respectively provided with two communication signals having phases opposite to each other.

Therefore, the present examples and embodiments are to be considered as illustrative and not restrictive and the invention is not to be limited to the details given herein, but may be modified within the scope and equivalence of the appended claims.

What is claimed is:

1. A semiconductor integrated circuit device that operates in a first mode based on first and second signals having phases opposite to each other, the semiconductor integrated circuit device comprising:
   a pair of external terminals that is provided with the first and second signals respectively; and
   a detection circuit for generating a detection signal that causes the semiconductor integrated circuit device to operate in a second mode different from the first mode when the pair of external terminals is provided with a third and fourth signals having the same phase respectively.

2. The semiconductor integrated circuit device of claim 1, wherein the first mode is a normal operation mode and the second mode is a test mode.

3. The semiconductor integrated circuit device of claim 1, wherein the detection circuit includes a comparator for detecting a signal level of each of the third and fourth signals and generating the detection signal.

4. The semiconductor integrated circuit device of claim 1, wherein the detection circuit includes:
   a logical circuit for generating a pulse signal using the third and fourth signals;
   a filter, connected to the logical circuit, for smoothing the pulse signal to generate a smooth signal; and a comparator, connected to the filter, for detecting a signal level of the smooth signal and generating the detection signal.

5. The semiconductor integrated circuit device of claim 1, further comprising:
   a test circuit, connected to the detection circuit, for measuring an output period during which the detection signal is being output from the detection circuit, and selecting one of a plurality of second modes based on a result of the measurement.

6. The semiconductor integrated circuit device of claim 1, further comprising:
   a period determination circuit, connected to the detection circuit, for measuring a predetermined period, and supplying power to the detection circuit until the predetermined period elapses.

7. The semiconductor integrated circuit device of claim 6, further comprising:
   a register, connected to the period determination circuit, for setting the predetermined period.

8. The semiconductor integrated circuit device of claim 1, wherein the pair of external terminals is one of a plurality of pairs of external terminals, and the detection circuit is one of a plurality of detection circuits corresponding to the plurality of pairs of external terminals.

* * * * *